United States Patent [19]

Chu et al.

[11] Patent Number: 5,384,541
[45] Date of Patent: Jan. 24, 1995

[54] PRECISION TIMED DELAY MEASUREMENT USING PHASELOCKED CW TECHNIQUE

[75] Inventors: David C. Chu, Woodside; Alistair D. Black, Los Gatos, both of Calif.

[73] Assignee: Hewlett-Packard Company, Palo Alto, Calif.

[21] Appl. No.: 26,933

[22] Filed: Mar. 5, 1993

[51] Int. Cl.⁶ ............................................. G01S 13/08
[52] U.S. Cl. ................................. 324/617; 324/76.53; 324/76.54; 324/621; 324/635; 324/644; 324/533; 368/120; 342/127; 342/124
[58] Field of Search ............... 342/124, 137, 123, 127; 324/617, 633, 643, 635, 644, 76.53, 76.54, 621, 533; 368/120

[56] References Cited

U.S. PATENT DOCUMENTS

| | | | |
|---|---|---|---|
| 3,853,005 | 12/1974 | Schendel | 324/643 |
| 3,938,042 | 2/1976 | Gliever et al. | |
| 3,940,636 | 2/1976 | Perahia | 333/154 |
| 3,965,416 | 6/1976 | Friedman | 324/633 |
| 4,164,648 | 8/1979 | Chu | |
| 4,503,433 | 3/1985 | Tomasi | 342/124 |

Primary Examiner—Kenneth A. Wieder
Assistant Examiner—Jose M. Solis

[57] ABSTRACT

A method and apparatus for the measuring of a delay in a delay circuit by making a continuous frequency measurement is proposed. The phase-locking of a variable frequency signal applied to the delay circuit allows the user to significantly improve the precision and accuracy of the time delay measurement. A scheme to extract the number of cycles stored in the delay circuit is also disclosed.

12 Claims, 10 Drawing Sheets

PRECISION TIMED DELAY MEASUREMENT USING PHASELOCKED CW TECHNIQUE

BACKGROUND OF THE INVENTION

The present invention relates to the measurement of a delay in a delay circuit by using a continuous frequency measurement.

There are many ways to measure a delay in a delay circuit. The conventional method of time interval measurement is a "start and stop" method. In this patent a measurement of a time delay between a start event and a stop event is made by counting the number of pulses of a master-clock signal which occurred between the start and stop events. This results in quantization of the measurement to 1 clock period. To measure time interval with resolution below 1 clock period requires special precision circuitry. See U.S. Pat. No. 4,164,648 which describes the double vernier time interval measurement using triggered phase-locked oscillators. Attempts to improve the resolution is usually expensive, because it needs an expensive high speed technique to very quickly capture both the start and the stop signals.

To measure short time durations, this method produces the high fractional error which is the quantization error divided by the time duration. Indeed, the master clock signal has quantization error connected with the (+1) or (−1) count ambiguity. The quantization error is equal to the period of the time-based clock. So, for a 100 MHz clock signal the quantization error is equal to 10 nsec. To measure a 100 nsec time interval, the fractional error is 10%.

Besides the quantization error, there is also a systematic measurement bias. Indeed, the start event is measured by the start channel trigger circuitry, and the stop event is measured by separate circuitry. Because the conventional technique uses two different measurement circuits for the start and stop events, any mismatch between them produces a systematic measurement bias. The typical systematic measurement bias is about 0.5 nsec. So, the fractional error for the start and stop method is even larger, because both quantization and systematic bias error contribute to the fractional error.

Repeated Start and Stop measurements can be made and the average result can be used to estimate the time interval. Depending on the rate at which these measurements are repeated, the average value may or may not converge to the time interval value. Even in the case where it converges, the convergence is slow and therefore time consuming. See the U.S. Pat. No. 3,938,042.

However, the averaging method does not reduce the systematic measurement bias and therefore the fractional error remains large even with averaging. Thus, it is desirable to provide an inexpensive time measurement method which reduces the fractional error for the measured delay time without having to reduce the quantization and systematic errors of time interval measurement.

SUMMARY OF THE INVENTION

The present invention is unique because it enables the practical realization of a precision time delay measurement using a phaselocked continues wave (CW) technique to reduce the fractional error of the time delay measurement.

One aspect of the present invention is directed to a method of precise measurement of delay time in a delay circuit. The method includes producing and applying the incident signal having a variable frequency to the delay circuit, detecting phase difference between the incident and delayed signals, converting the phase difference into a feedback signal, and integrating and filtering the feedback signal. By varying the variable frequency of the incident signal in response to the feedback signal in such direction as to decrease the phase difference between the incident and the delayed signals, locking of the phase is achieved and a phase lock loop is established.

When the phase lock loop is in lock, the phase difference would be practically zero. Therefore, the target delay is a multiple of the signal period. A precise measurement of the signal period can be made by measuring the average frequency of the phase-locked signal. The number of pulses in the delay circuit called the harmonic number is then determined. The precisely measured circuit time delay is equal to the precisely measured period of the variable signal multiplied by the harmonic number.

In one embodiment the step of determining the harmonic number simultaneously enables a harmonic number counter to measure the number of pulses in the delay circuit and blocking further signals to the target delay circuit. The harmonic number is equal to the integral number of impulses in the delay line when further signals are blocked.

To prevent the source frequency from being very high in another embodiment when measuring very short delays, the delay circuit has two components in tandem: the first component being a fixed premeasured and therefore known delay circuit component, the second component being the target delay circuit component.

In another method of the time delay measurement the detecting step detects a reflected signal that has traveled in the delay circuit.

In yet another method of the time delay measurement the producing and applying step splits the incident signal.

Another aspect of the present invention is directed to a measuring apparatus to make the precise measurements of the delay in the target delay circuit. The apparatus includes means for producing and applying an incident signal having a variable frequency to a target delay circuit, means for detecting a phase difference between the incident and delayed signals, means for converting the phase difference into a feedback signal and means for integrating and filtering the feedback signal. The apparatus also includes means for varying the frequency of the reference signal in response to the feedback signal in such direction as to reduce the phase difference. When the phase difference is zero the phase locking is achieved and the phase lock loop is established and stabilized. The apparatus further includes means for precisely measuring frequency of the phase-locked signal when the loop is stabilized, and means for determining the number of impulses in the delay circuit or the harmonic number. The precise measurement of the circuit time delay is obtained by multiplying the precisely measured period of the phase-locked incident signal by the harmonic number.

In one embodiment, the apparatus for measuring the harmonic number includes a harmonic number counter and a gating means to block further signals to the target delay circuit. The harmonic number is equal to the integral number of impulses in the delay circuit counted by the counter when further signals are blocked.

In one embodiment the apparatus for precise time delay measurement includes a delay line with a discontinuity at the end.

In another embodiment a directional coupler means connected between the producing and applying means and the detecting means is used for splitting the reference signal into two signals.

Yet in another embodiment two 3-dB power splitters connected between the producing and applying means and the detecting means are used for splitting the reference signal into two signals.

BRIEF DESCRIPTION OF THE DRAWINGS

Identical components in the figures are labeled by the same numerals.

DETAILED DESCRIPTION OF THE PREFERRED EMBODIMENT

Figure 1A:
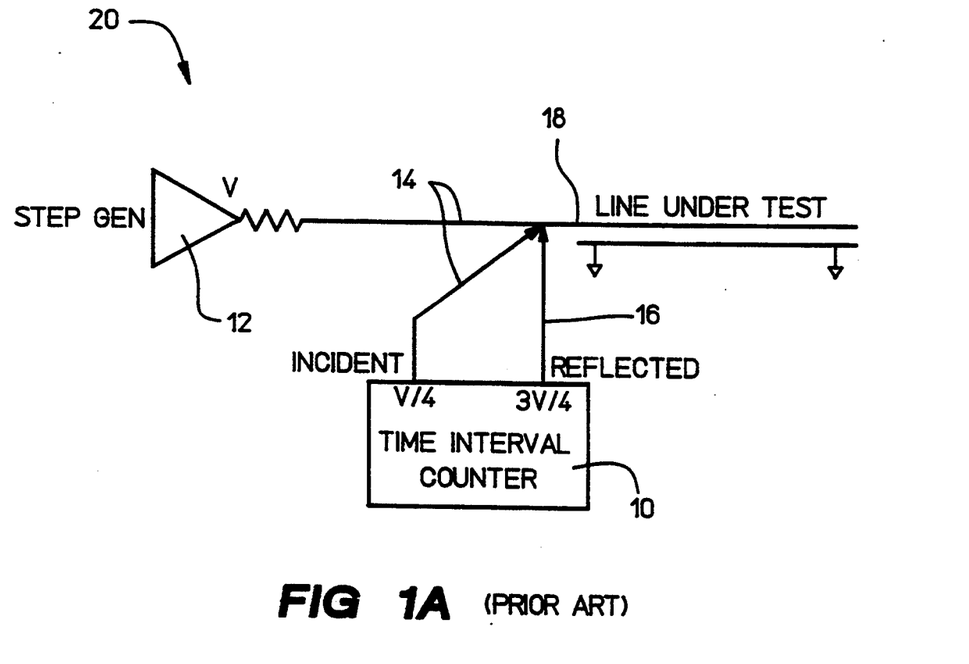
FIG. 1A is a schematic circuit diagram employing a Time Domain Reflectometry (TDR) method for measuring time intervals to illustrate the prior art when the reflected signal is measured at the same point as the incident signal.

The time interval measurement method using the Time Domain Reflectometry (TDR) technique for the time delay measurement is well known in the art. In reference to FIG. 1A the schematic circuit 20 illustrates the time interval measurement method using the TDR technique. The circuit 20 includes the step generator 2, the transmission line 18 under test with the characteristic impedance Z and the time interval counter 10. The start (incident) signal 14 will be reflected at the end of the transmission line if the line is not terminated with the resistance R=Z. If the line is an open circuit, the reflected signal 16 will be of the same polarity as the incident signal and the reflected signal will travel back from the end to the beginning of the line. If the start signal has the amplitude of V/2 and the time delay of the delay line is D, than 2D time later the signal with the amplitude of V will appear at the input of the transmission line. If the threshold of the start channel of the time interval counter 10 is set at V/4, and the threshold of the stop channel of the time interval counter is set at the 3V/4, the start channel will be triggered by the incident signal and the stop channel will be triggered by the reflected signal. The gate time for the counter G is equal to the time of one single measurement, which in the case of TDR method is the difference in time between two triggering events at the start and the stop channels; in this situation the gate time G is equal to twice the delay time D, (i.e., G=2D). In the circuit diagram shown in the FIG. 1A the incident signal is measured as the start signal, and the reflected signal is measured as the stop signal.

Figure 1B:
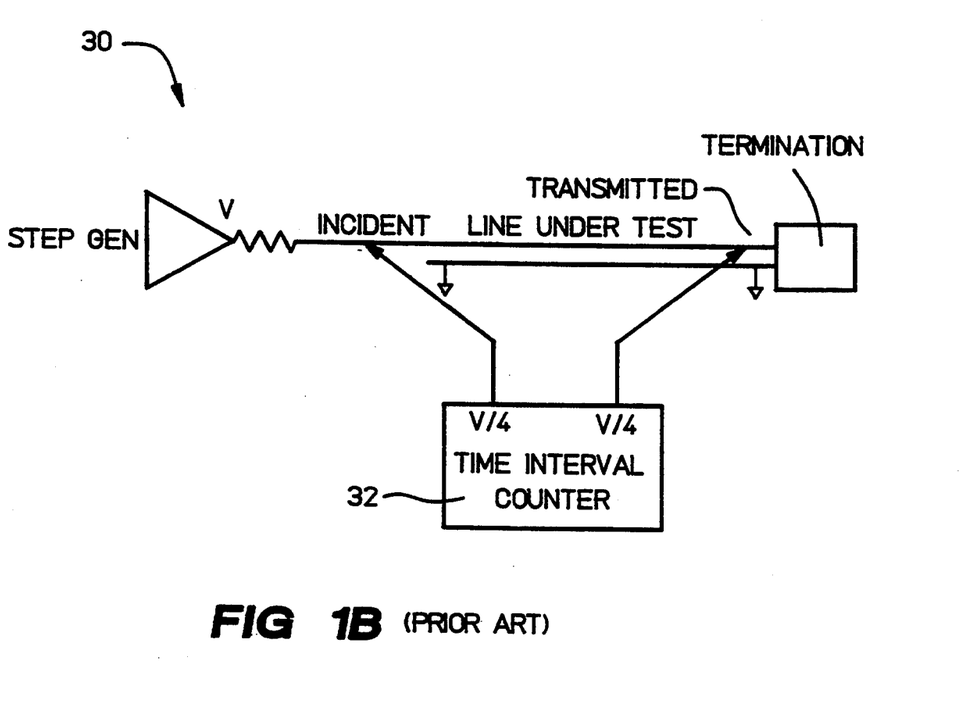
FIG. 1B is a schematic circuit picture employing a time interval measurement method for measuring time intervals to illustrate the prior art when both ends of the delay line are available for measurement.

The circuit diagram 30 in FIG. 1B depicts the transmission line with both ends available for the measurement of the delay time. It includes the time interval counter 32 which has two measurement channels, one for the start signal and for the stop signals, both channels having the threshold voltage V/4. So, in this situation it is possible to measure the incident signal as the start signal and the delayed signal as the stop signal. The gate time G in this situation is equal to the delay time D, (i.e., G=D).

Figure 2A:
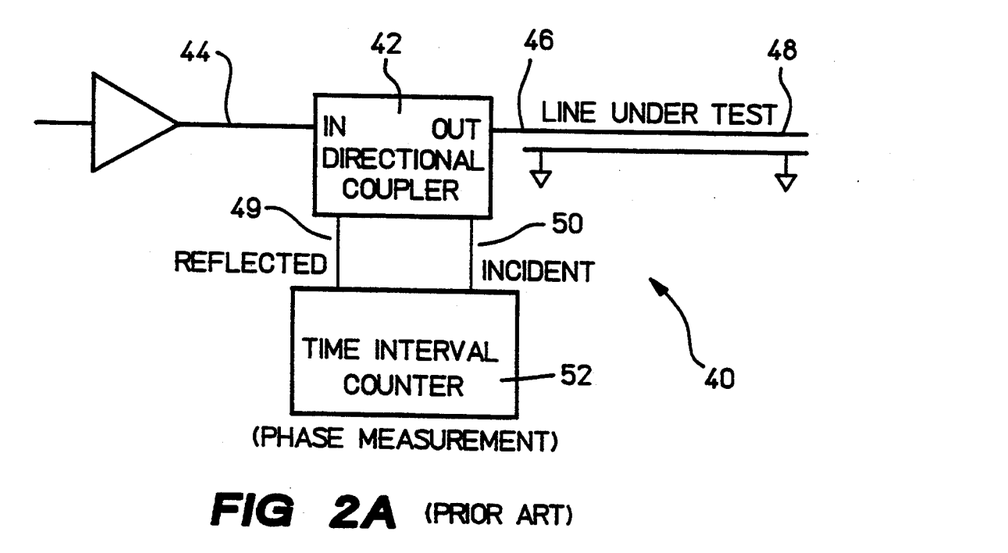
FIG. 2A illustrates a schematic circuit diagram of a time interval measurement circuit including a Directional Coupler to separate the incident and the reflected signals.
Figure 2B:
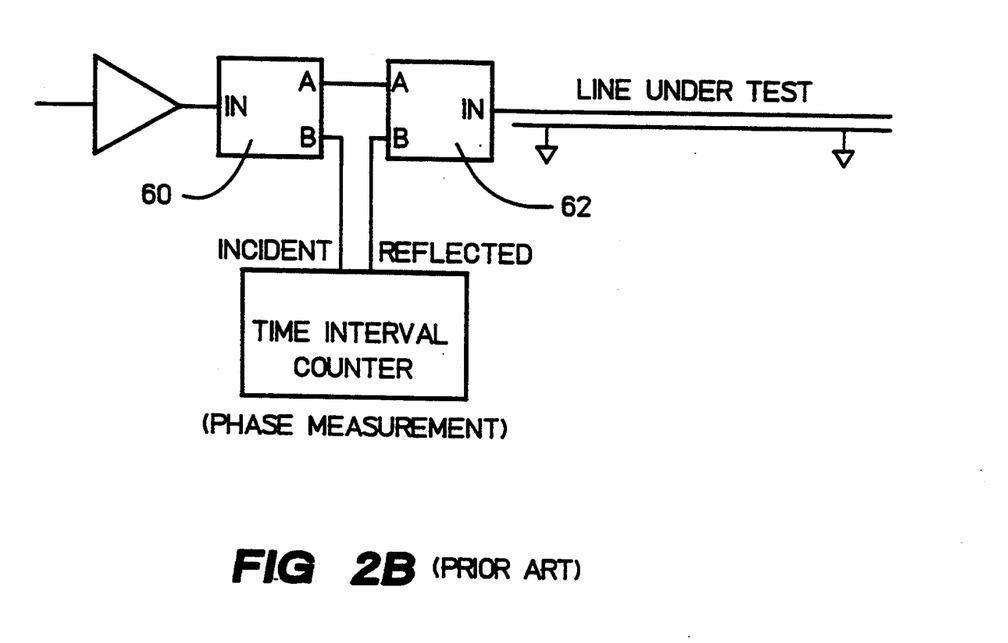
FIG. 2B illustrates a schematic circuit a time interval measurement circuit including two 3-dB power splitters working as the Directional Coupler to separate the incident and the reflected signals.

The time interval measurement method using TDR technique method can be modified by using the directional coupler. The start or input signal 44 can be split into two signals using the directional coupler 42 as shown in the FIG. 2A. The first part of the signal 44 will appear immediately at the incident port as an incident signal 50. Nothing appears at the reflection port at this time. The other part of the input signal appears immediately as the output signal 46. The output signal 46 will travel through the delay line 48 under test, be reflected, and appears at the reflected port only as the reflected signal 49. Nothing will appear at the incident port due to the reflection. The time interval counter 52 measures the time difference between the incident and the reflected signals. As shown in the FIG. 2B two 3-dB power splitters 60 and 62 can be also used instead of the directional coupler 42 to perform the same function.

The time measurement method has certain shortcomings. The fractional error $\Delta X$ for variable X is defined as $\Delta X/X$. Therefore for a signal frequency f and frequency error $\Delta f$ the fractional error is equal to $\Delta f/f$. The fractional error $\Delta f/f$ is equal to the ratio of the sum of the quantization error Q and the systematic bias error B divided by the gate time G: $\Delta f/f = (Q+B)/G$. The quantization error Q is equal to the finest granularity of the measurement. The typical quantization error ranges between 10 nsec and 10 psec depending on the price of the instrument. The systematic bias error B is the error connected with the existence of the two separate measurement channels, one channel measuring the start clock signal, and the other channel measuring the stop clock signal. The typical bias error B=0.5 nsec.

Since the delays are typically short, the inevitable quantization and systematic errors will result in a relatively large fractional error in the measurement. The fractional error can be significantly reduced by using the inexpensive and very accurate method of the continuous time delay measurement which is the subject-matter of the present invention.

Continuous time delay measurement of the circuit delay decreases the fractional error by increasing the gate time of the measurement.

If one makes the time interval measurement by properly averaging over N repeated measurements, the practical minimum measurement time increases and will be greater than 2 NG. The fractional error in this case $\Delta f/f = (Q/N^{\frac{1}{2}} + B)/G$ according to the time interval averaging method disclosed in the U.S. Pat. No. 3,938,042.

In the proposed method of the time delay measurement of this application discussed in details below, the measured time delay D is equal to the period T of the reference signal multiplied by the harmonic number H: $D = T \times H$. So, in order to measure the time delay D it is sufficient to measure the period T of the reference signal. Since the period T is the reciprocal of frequency f: $T = 1/f$, $\Delta f/f = -\Delta T/T$. In other words the fractional error for frequency f and for period T have the same magnitude. Since delay $D = T \times H$, the fractional error for the delay is equal to $\Delta D/D = H \times \Delta f/f$. So, the fractional error for the proposed method is equal to $(Q+B)/(\text{gate time})$, where the gate time can be chosen. For the sake of comparison one can choose a gate time equal to the measurement time of the prior art in which N measurements are made. In this case the gate time is equal to 2 NG and the fractional error is equal to $(Q+B)/2$ NG, which is much smaller than the fractional error in the prior art. In other words, using the same time interval counter to measure for the same measurement time, a much better result can be obtained. If measurement time is actually greater than 2 NG, the fractional error is even smaller.

Figure 3A:
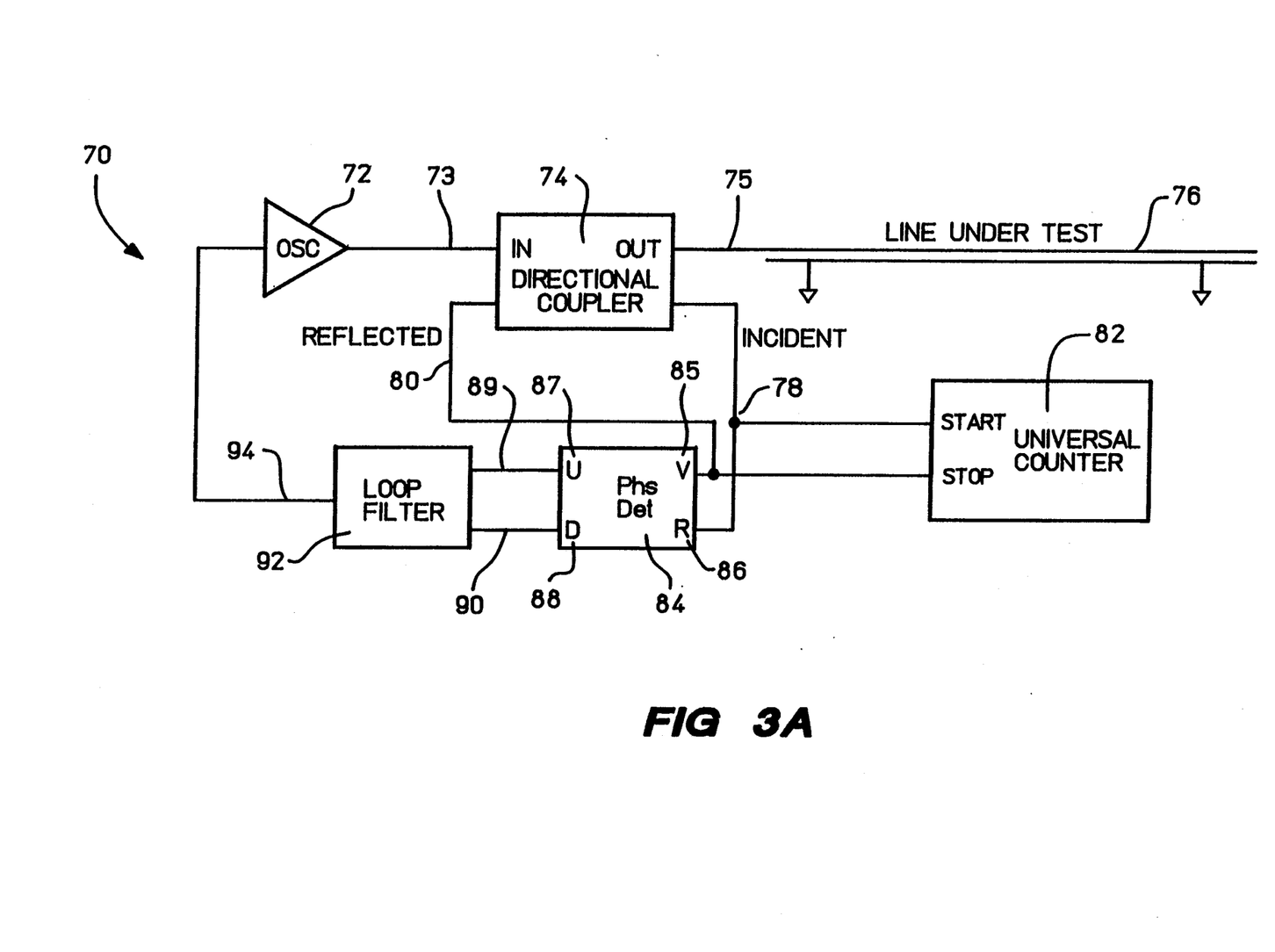
FIG. 3A is a schematic circuit diagram for continuous frequency measurement of a time delay in the delay circuit including a directional coupler and using the conventional time interval measurement method for the rough determination of the harmonic number to illustrate an embodiment of this invention.

The proposed continuous wave (CW) method of the time delay measurement in a delay line with the discontinuity at the end is depicted in the FIG. 3A. The circuit 70 in the FIG. 3A includes oscillator 72 generating the input signal 73 with a variable reference frequency f. The input signal 73 enters the directional coupler 74 and is split into two parts. One part of the input signal appears immediately at the incident port 78 of the directional coupler as the Incident signal. Nothing appears at the reflected port 80 at this time. The other part of the input signal is the output signal 75. The signal 75 travels through the delay line 76, gets reflected and appears at the reflected port only. The reflected signal does not appear at the incident port. These two signals, the incident signal 78 and the reflected signal 80, are fed into the phase detector 84. The phase detector has four ports: port 85 for the variable frequency V signal, port 86 for the reference frequency R signal, port 87 for the Up signal, and port 88 for the Down signal, which is well known in the art. The phase detector detects the phase difference between the incident and the reflected signals and produces the Up and Down signals 89, 90. The Up and Down signals taken together as a differential pair is proportional to the phase difference of the two signals to the nearest cycle. These signals are fed into the Loop filter 92, which typically integrates and low-pass filters the signals. The loop filter output signal 94 is fed-back to tune the oscillator 72. The feedback is made in such direction as to reduce this phase difference, in other words by negative feedback, thus establishing a phase lock loop. When the phase lock loop is stabilized, the phase difference will be made essentially zero by the loop. After the loop is stabilized, the average frequency of the frequency source is measured precisely. Having measured the frequency one can determine a rough absolute circuit time delay using by the universal counter 82. The universal counter measures a rough time interval of the time delay of the circuit in a manner similar to that described above in reference to FIG. 2A. After taking the ratio between the rough measured time delay and the period of the reference signal and rounding it to the nearest integer, one can determine the Harmonic Number H. H is equal to the number of periods of the reference signal in the rough measured time delay, and is the number of pulses in the delay circuit. The precise measured circuit time delay D is equal to the precisely measured period of the reference signal T multiplied by the harmonic number H : $D = T \times H$.

Figure 3B:
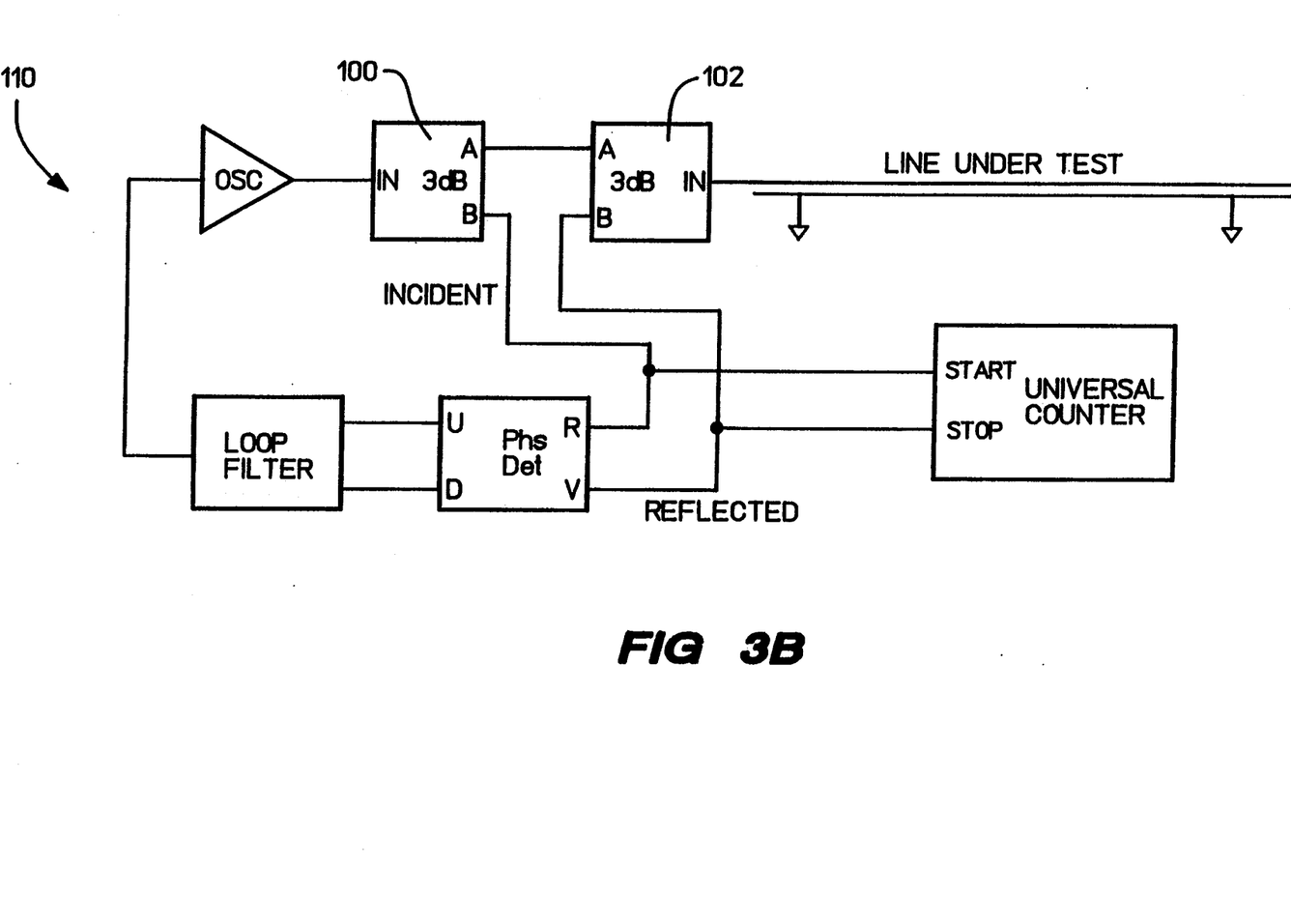
FIG. 3B illustrates an embodiment of this invention for the continuous frequency measurement of a time delay in the delay circuit, employing two 3-dB power splitters and using the conventional time interval measurement method for the rough determination of the harmonic number.

The circuit 110 depicted in FIG. 3B employs two 3-dB power splitters 100 and 102 which perform the same function as the directional coupler of the diagram 70 depicted on the FIG. 3A.

Figure 4A:
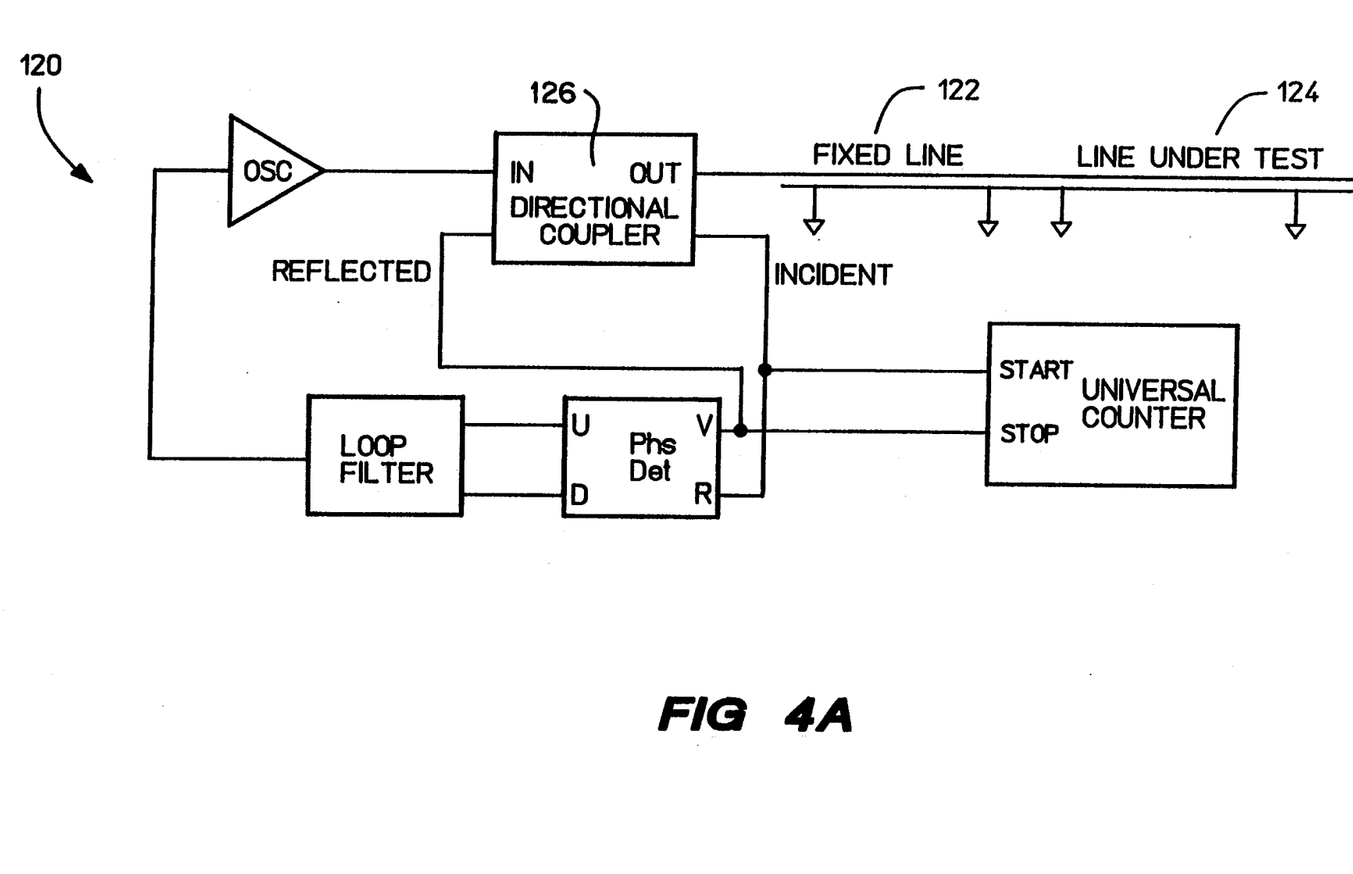
FIG. 4A is a schematic circuit diagram of a circuit for the continuous frequency measurement of a time delay in the delay circuit with a fixed delay line to illustrate this invention.
Figure 4B:
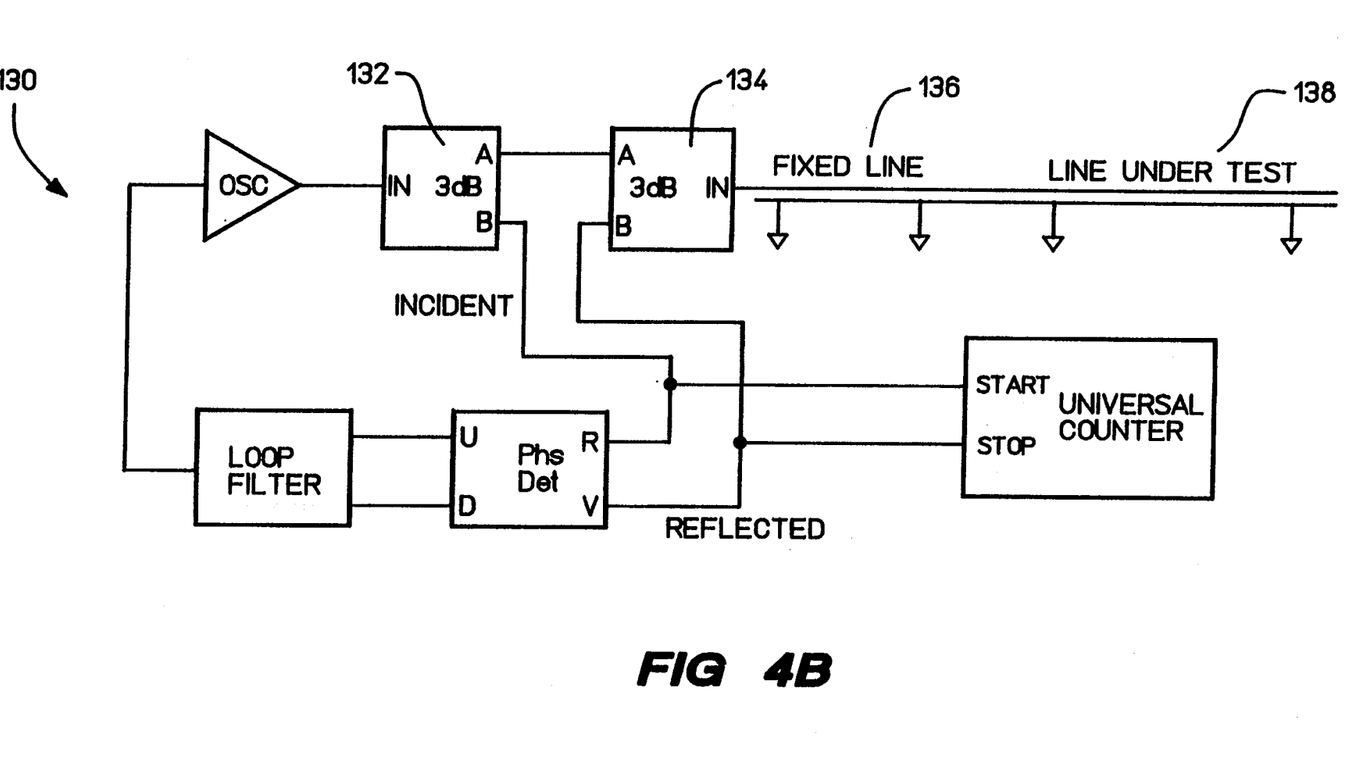
FIG. 4B illustrates a circuit of this invention for the continuous frequency measurement of a time delay in the delay circuit with a fixed delay line and with two 3-dB power splitters.

In the case of the very short delay line D the frequency of the frequency source $f = 1/T = H/D$ can be very high. The circuit 120 depicted in FIG. 4A has a delay circuit with the two components in tandem: the first circuit 122 having a fixed premeasured and therefore known delay component $D_0$ and the second circuit 124 having a target delay circuit component $D_1$. Thus the known fixed delay circuit reduces the variable range of the frequency source and prevents the frequency of the frequency source from being excessive, because the frequency f is equal to $1/T = H/(D_0+D_1)$ and can not be greater than $H/D_0$. The circuit diagram 130 measuring the delay time in the delay circuit 138 with the fixed component 136 depicted in FIG. 4B employs two 3-dB power splitters 132 and 134 instead of the directional coupler 126 used in the circuit 120 in FIG. 4A.

Figure 5A:
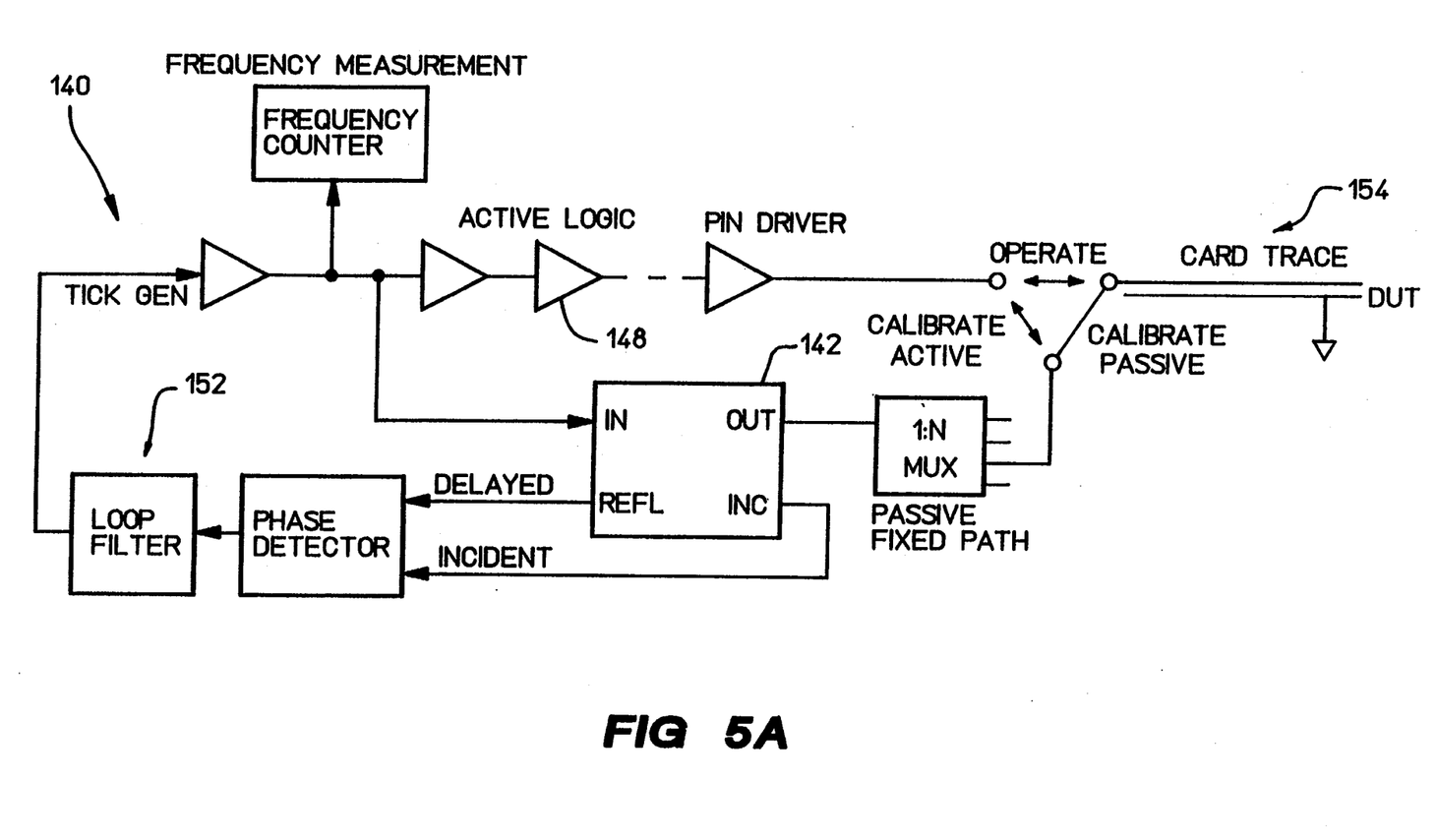
FIG. 5A is a schematic circuit diagram of a IC tester calibration circuit to illustrate the present invention for the continuous frequency measurement of the time delay.

One of the applications of the proposed method for the precise measuring of the delay in a delay circuit by making a continuous frequency measurement is the IC tester calibration, shown as circuit 140 in FIG. 5A. The pin driver for each IC pin is typically located at some distance from its pin under test; therefore there is a finite delay between the pin and its pin-driver. It is necessary to very precisely measure such delay time during calibration. Such delay time can be compensated for during actual IC testing.

Figure 5B:
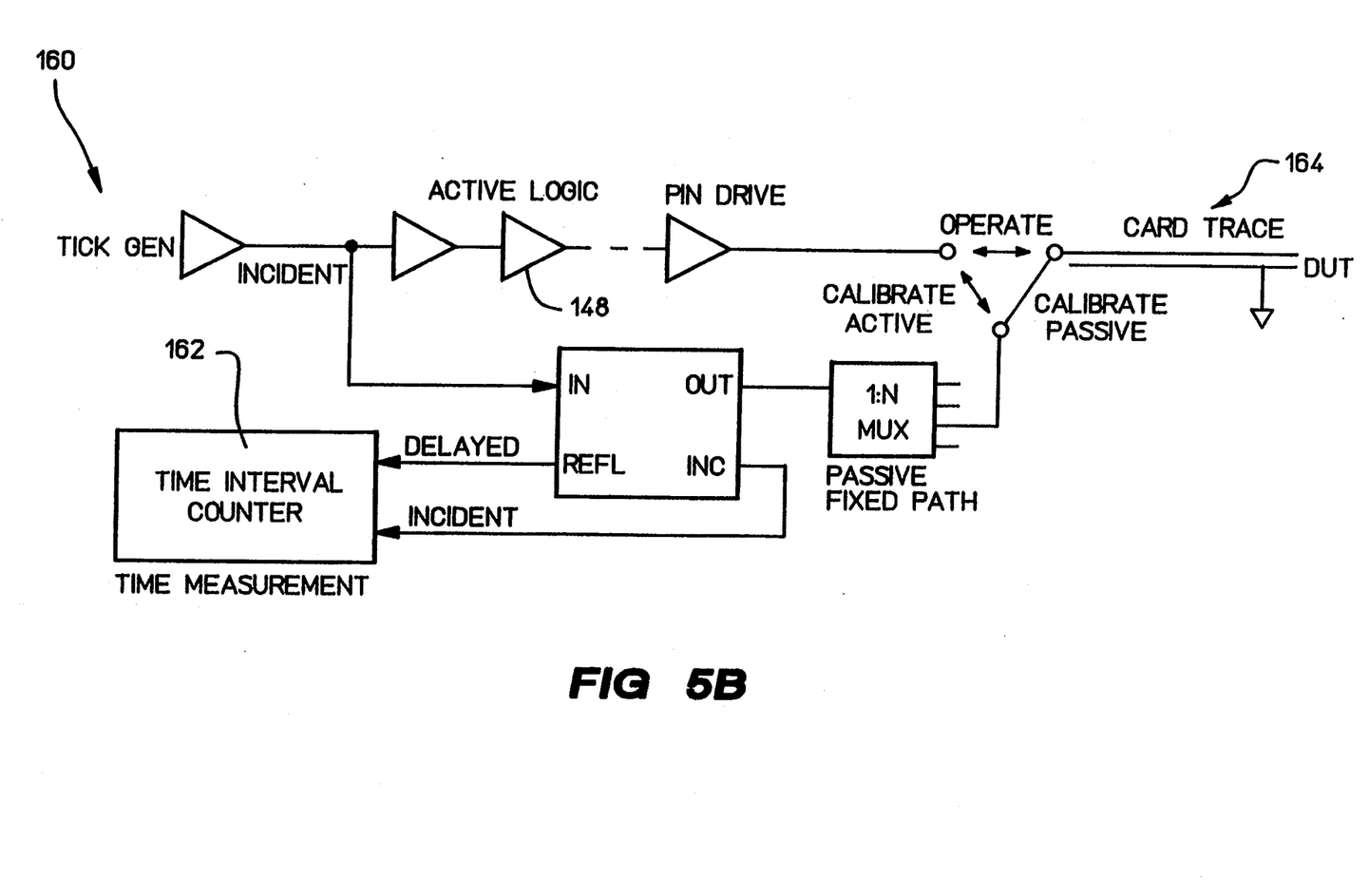
FIG. 5B illustrates a IC tester calibration circuit using the time interval measurement method of the time delay of this invention.

FIGS. 5A and 5B show two possible ways to calibrate out the delays for each pin of an IC tester. The method in FIG. 5A is based on frequency measurement, and FIG. 5B is based on time interval measurement.

In FIG. 5A, the delay has two parts, an Active Logic delay path 148, which includes the Pin Driver Electronics at the end; and a passive part 154 labeled Card Trace 154, which represents the physical distance to the pin under test. During calibration of the passive delay, the switch is closed connecting the i:N Multiplexer to the Card Trace 154. The MUX is passive and has constant delay for all paths. Signal from the frequency source labeled Tick Gen drives the Directional Coupler 142 at the IN port. One portion of this signal appears instantly at the port labeled Inc and is fed to one arm of the phase detector. The output of the directional coupler is routed to the pin under test via the 1:N MUX. At the end of the trace, the signal is reflected and travels through the MUX in the opposite direction and re-enters the directional coupler through the OUT port, and emerges at the Refl port to feed the other arm of the phase detector which converts the phase difference of the two arms into a feedback signal. The signal is processed by the Loop Filter and fed back to tune the Tick Gen, completing the phase lock loop. When the loop is stabilized, the frequency or period of the Tick Gen is measured. The MUX is then switched to a new pin to repeat the measurement for the new pin. For active circuit calibration, the switch is closed connecting the Pin Driver Electronics to the MUX. The signal from the pin driver will be routed to the OUT port of the coupler 142 (instead of the reflected signal from the trace). Otherwise, the operation is the same as in the passive delay calibration. In normal IC test operation, the pin driver is connected to the DUT via the card trace, and the MUX is not connected to either. The phase lock loop is also disabled.

In FIG. 5B, a time interval counter 162 is used to measure the time between incident and reflected signal. The Tick Gen is operated at a convenient rate.

For simplicity, harmonic number determination circuits are omitted in both figures.

Figure 6:
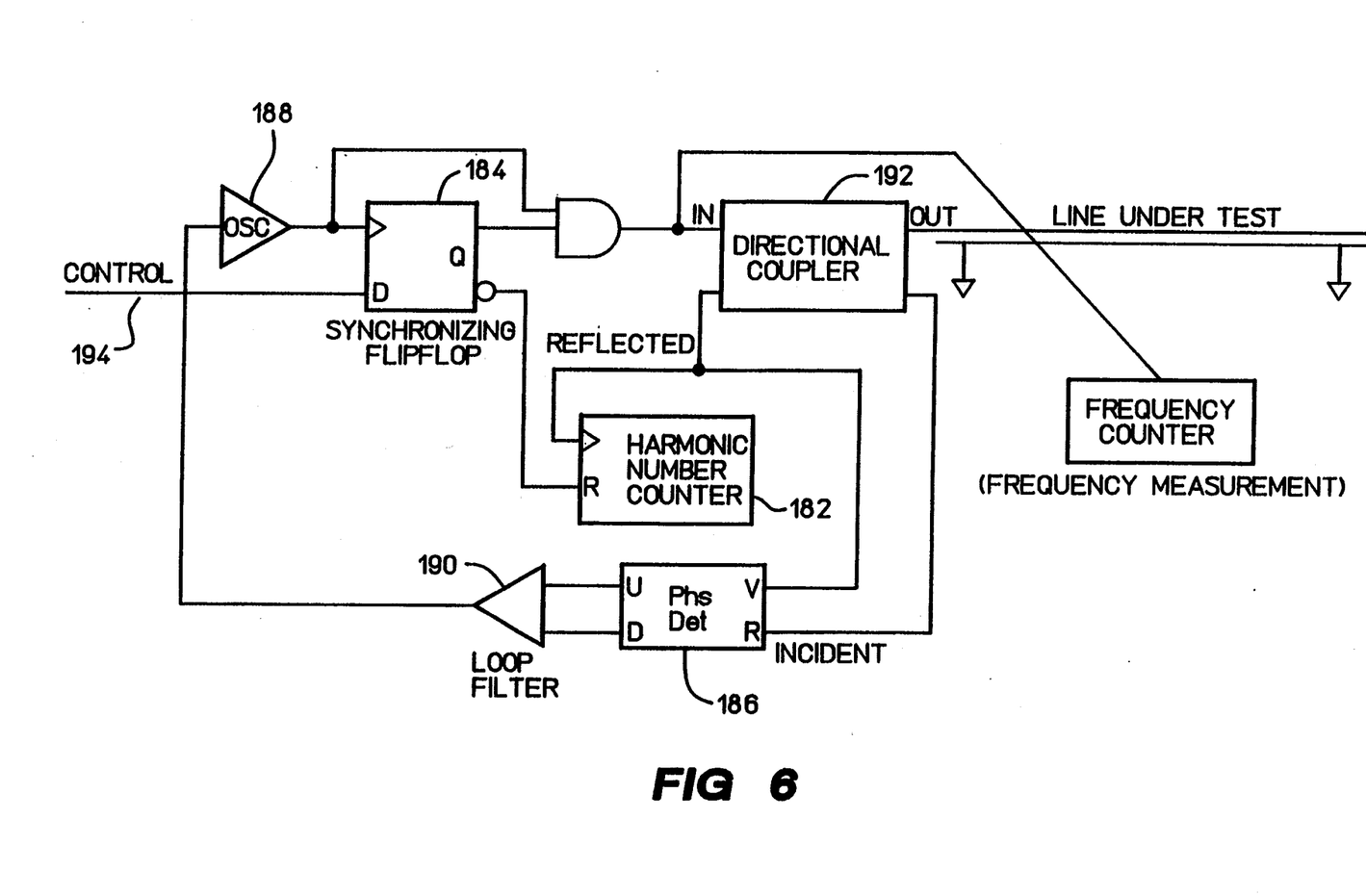
FIG. 6 illustrates the present invention for the time delay measurement in the delay circuit using the continuous frequency measurement and using the harmonic number counter for the determination of the harmonic number.

The circuit 180 in FIG. 6 illustrates a method to determine the harmonic number H directly using the harmonic number counter 182 and the synchronizing flip-flop 184. The order of the operations is as follows. First, the phase loop is stabilized. Then the frequency is measured. Only after the frequency is measured, one can make the determination of the harmonic number.

The circuit shown in FIG. 6 works as follows. The control signal 194 being normally high causes the synchronizing flip-flop to be in the high state. This enables the oscillator signal to be gated through the directional coupler and the phase-locked loop is activated. After the phase-lock is acquired and stabilized, a reference measurement is made on the oscillator frequency. During the loop operation the harmonic number counter is reset and held at 0 count. At a convenient time after the frequency measurement, the control signal 194 is switched low. At the next oscillator clock transition the synchronizing flip-flop is switched to the low state. This will block further signal to the directional coupler. At the same time the harmonic number counter is enabled. Any signal stored in the delay circuit will continue progressing towards the harmonic counter. An integer number of pulses, one pulse per signal period, will be counted by the counter and is equal to the harmonic number H. The delay measurement is equal the oscillator period multiplied by the harmonic number, and the delay measured is equal to twice the circuit delay. It should be noted, that the harmonic number measurement may disrupt the phase lock loop, and hence should be performed after the frequency measurement is made.

Figure 7:
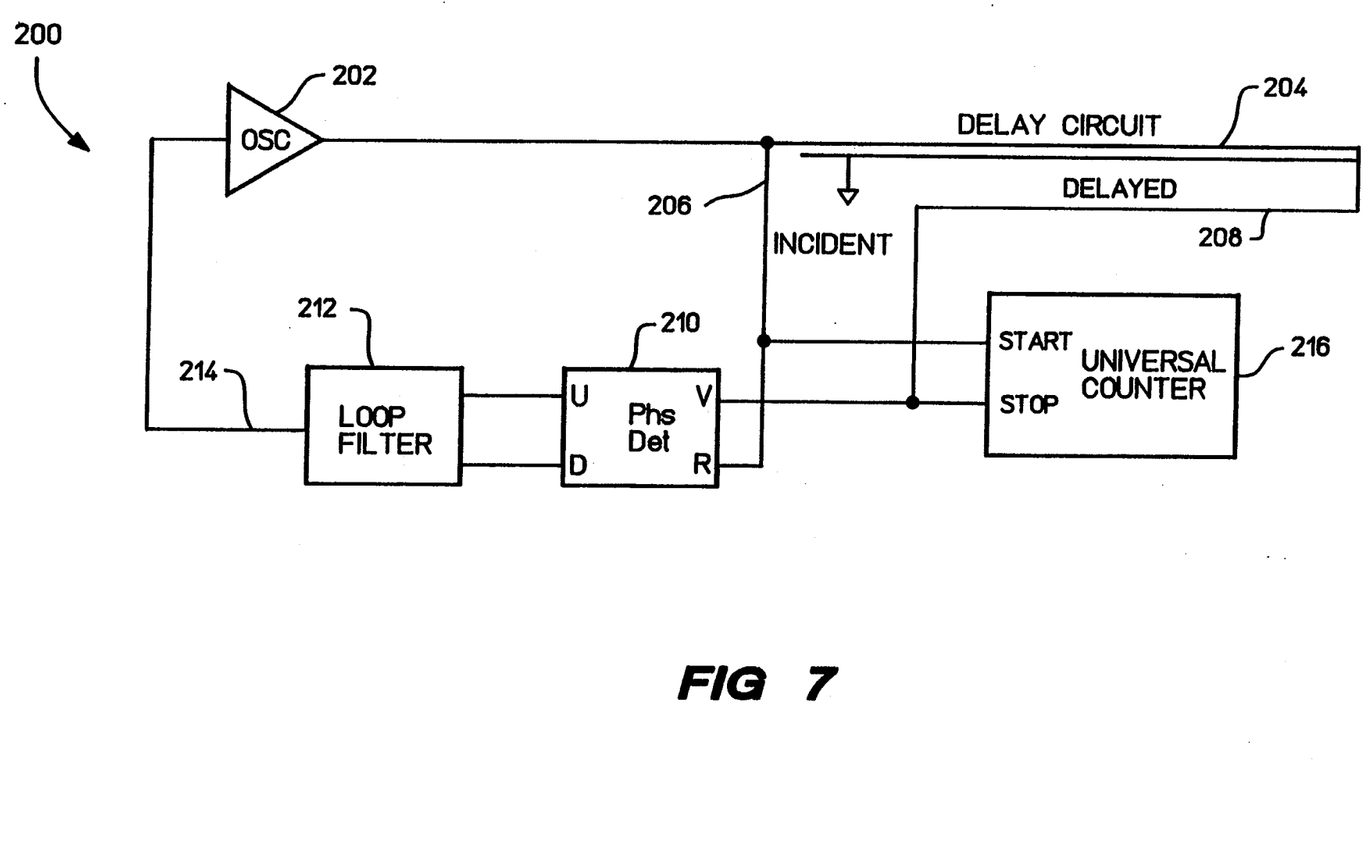
FIG. 7 illustrates the present invention for the time delay measurement in the delay line using the incident and delayed signals.

The circuit diagram 200 depicted in FIG. 7 functions like the circuit diagram showed in FIG. 3A. The only difference is that in FIG. 3A only one end of the target delay line is available, as opposed to the diagram in FIG. 7 where both ends of the target delay line 204 are available. Accordingly the diagram in FIG. 3A employs the directional coupler 74, and the diagram 200 does not.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A method of measuring a delay in a delay circuit by making a continuous frequency measurement, which comprises:
    producing and applying an incident signal having a variable frequency to the delay circuit;
    detecting a phase difference between the incident and delayed signals that has traveled through the delay circuit;
    converting said phase difference, to the nearest cycle, into a feedback signal;
    integrating and filtering said feedback signal;
    varying the variable frequency of the incident signal in response to said filtered feedback signal in such direction as to reduce said phase difference, thereby establishing a phase lock loop;
    measuring the average frequency of the incident or delayed signal when said loop is stabilized; and
    determining the number of periods between the incident and delayed signals in the delay circuit defining a harmonic number, said circuit time delay being equal to said harmonic number multiplied by the period of said variable frequency source corresponding to said measured average frequency.

2. The method of claim 1;
    wherein said harmonic number determining step includes:
    making a rough delay measurement using the time interval measurement method;
    taking the ratio between the rough measured time delay and the period of said variable frequency source; and
    rounding said ratio to the nearest integer, said integer being the harmonic number.

3. The method of claim 1 wherein the detecting step detects a reflected signal that has traveled in the delay circuit.

4. The method of claim 1 wherein the producing and applying step splits said incident signal.

5. The method of claim 1, wherein the step for determining a harmonic number includes blocking further signals to the target delay circuit, and counting the integral number of whole periods in the delay circuit.

6. A measuring apparatus comprising:
    means for producing and applying an incident signal having a variable frequency to a target delay circuit;
    means for detecting a phase difference between the incident and delayed signals that has traveled through the delay circuit;
    means for converting said phase difference, to the nearest cycle, into a feedback signal;
    means for integrating and filtering said feedback signal;
    means for varying the variable frequency of the reference signal in response to said feedback signal in such direction as to reduce said phase difference, thereby establishing a phase lock loop;

means for measuring the average frequency of the variable frequency source when said loop is stabilized; and means for determining the number of whole periods in the delay circuit defining a harmonic number, said circuit time delay being equal to said harmonic number multiplied by the period of said variable frequency source corresponding to said measured average frequency.

7. The measuring apparatus of claim 6, and wherein means for determining said harmonic number includes:

gating means for controlling the application of the incident signal to the delay circuit; and a counter means for determining the harmonic number.

8. The measuring apparatus of claim 6 wherein the target delay circuit comprises a delay line with a discontinuity at the end; wherein the detecting means detect the incident and reflected step signals at the same incident point in the circuit; and wherein said time delay is equal to one half of the period of said variable frequency source multiplied by said harmonic number.

9. The apparatus of claim 6, further including a directional coupler means connected between the producing and applying means and the detecting means for splitting said incident signal into two signals, one signal being applied to the detecting means and the other to the delay circuit.

10. The apparatus of claim 6, further including two 3-dB power splitters, connected between the producing and applying means and the detecting means for splitting said incident signal into two signals, one signal being applied to the detecting means and the other to the delay circuit.

11. The apparatus of claim 6 further comprising a fixed known delay circuit component, arranged in series with said target delay circuit, and wherein said known fixed delay circuit reduces the variable range of the frequency source as a result of variation of the target delay circuit and prevents the phase difference from being excessive for small delays.

12. The measuring apparatus of claim 6 wherein said means for determining a harmonic number includes gating means and a harmonic number counter, wherein said gating means enables the counter and blocks further signals to the target delay circuit, said harmonic number being equal to the integral number of periods in the delay circuit.

* * * * *